US012769993B2

United States Patent
Wu et al.

(10) Patent No.: US 12,769,993 B2
(45) Date of Patent: Oct. 20, 2026

(54) INFORMATION PROCESSING CIRCUIT AND INFORMATION PROCESSING METHOD

(71) Applicant: TSINGHUA UNIVERSITY, Beijing (CN)

(72) Inventors: Huaqiang Wu, Beijing (CN); Zhengwu Liu, Beijing (CN); Bin Gao, Beijing (CN); Jianshi Tang, Beijing (CN); He Qian, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 1345 days.

(21) Appl. No.: 17/402,263

(22) Filed: Aug. 13, 2021

(65) Prior Publication Data

US 2022/0047200 A1 Feb. 17, 2022

(30) Foreign Application Priority Data

Aug. 14, 2020 (CN) ........................ 202010819145.X

(51) Int. Cl.
*G11C 11/54* (2006.01)
*G06N 3/045* (2023.01)
(Continued)

(52) U.S. Cl.
CPC ............. *G06N 3/065* (2023.01); *G06N 3/045* (2023.01); *G06N 3/09* (2023.01); *G11C 11/54* (2013.01);
(Continued)

(58) Field of Classification Search
CPC ......... A61B 5/31; A61B 5/291; A61B 5/7225; G06N 3/065; G06N 3/045; G06N 3/09;
(Continued)

(56) References Cited

U.S. PATENT DOCUMENTS 10,311,375 B2 * 6/2019 Basu ........................ G06F 17/16
11,403,518 B2 * 8/2022 Otsuka .................. G06N 3/048
(Continued)

FOREIGN PATENT DOCUMENTS

CN 109800729 A 5/2019

OTHER PUBLICATIONS

Translation of Office action from The State Intellectual Property Office of People's Republic of China, Application No. or Publication No. 202010819145.X (# 100080), 2024. (Year: 2024).*

*Primary Examiner* — Mushfique Siddique
(74) *Attorney, Agent, or Firm* — Loeb & Loeb LLP

(57) ABSTRACT

An information processing circuit and an information processing method. The information processing circuit includes: a signal acquisition circuit and a signal processing circuit, the signal acquisition circuit is configured to acquire a plurality of initial neural signals that are different, the signal processing circuit includes a plurality of memristors and is configured to process the plurality of initial neural signals through the plurality of memristors, and the plurality of memristors includes a plurality of first memristors, the plurality of first memristors are arranged in an array to obtain a preprocessing array, the preprocessing array is configured to extract features of the plurality of initial neural signals to obtain a plurality of feature information.

13 Claims, 5 Drawing Sheets

(51) Int. Cl.
*G06N 3/065* (2023.01)
*G06N 3/09* (2023.01)
*G11C 13/00* (2006.01)

(52) U.S. Cl.
CPC ...... *G11C 13/0002* (2013.01); *G11C 13/0069* (2013.01)

(58) Field of Classification Search
CPC ...... G06N 3/0499; G06N 3/063; G11C 11/54; G11C 13/0002; G11C 13/0069; G11C 2013/0073; G11C 13/0007; G11C 13/0023
USPC ........................................................... 365/148
See application file for complete search history.

(56) References Cited

U.S. PATENT DOCUMENTS

| | | | | |
|---|---|---|---|---|
| 12,217,164 | B2 * | 2/2025 | Li | G06N 3/065 |
| 2018/0075339 | A1 * | 3/2018 | Ma | G06F 7/48 |
| 2018/0356771 | A1 * | 12/2018 | Basu | A61F 2/72 |
| 2020/0237311 | A1 * | 7/2020 | Li | A61B 5/7207 |
| 2023/0409892 | A1 * | 12/2023 | Lee | G06N 3/063 |
| 2024/0112005 | A1 * | 4/2024 | Kim | G06F 1/324 |
| 2024/0157144 | A1 * | 5/2024 | Lauro | A61B 5/7267 |
| 2024/0170060 | A1 * | 5/2024 | Wu | G11C 13/004 |

* cited by examiner

INFORMATION PROCESSING CIRCUIT AND INFORMATION PROCESSING METHOD

CROSS-REFERENCE TO RELATED APPLICATION

The present application claims the priority to the Chinese patent application No. 202010819145. X filed on Aug. 14, 2020, and the entire context of this Chinese patent application is incorporated herein by reference.

TECHNICAL FIELD

Embodiments of the present disclosure relate to an information processing circuit and an information processing method.

BACKGROUND

With the progress of science and technology, people have gradually realized the analysis of neural signals and the use of their results. For example, the neural signals emitted by brain are analyzed through a brain-computer interface to help people with neurological diseases monitor and control the diseases.

However, the existing neural signal analysis circuits usually separate their storage unit and computation unit, and also need to do a lot of analog-to-digital conversion, requiring many hardware resources, long analysis and calculation time, large circuit area and high power consumption.

SUMMARY

At least one embodiment of the present disclosure provides an information processing circuit, comprising a signal acquisition circuit and a signal processing circuit, the signal acquisition circuit is configured to acquire a plurality of initial neural signals that are different; the signal processing circuit comprises a plurality of memristors and is configured to process the plurality of initial neural signals through the plurality of memristors, where the plurality of memristors comprise a plurality of first memristors, the plurality of first memristors are arranged in an array to obtain a preprocessing array, and the preprocessing array is configured to extract features of the plurality of initial neural signals to obtain a plurality of feature information.

For example, in the information processing circuit provided by at least one embodiment of the present disclosure, the signal processing circuit comprises a preprocessing sub-circuit and a decoding sub-circuit; the preprocessing sub-circuit comprises the preprocessing array, the decoding sub-circuit is coupled with the preprocessing sub-circuit and configured to decode the plurality of feature information to determine a state classification corresponding to the plurality of initial neural signals.

For example, in the information processing circuit provided by at least one embodiment of the present disclosure, the preprocessing array comprises M rows*N columns of the first memristors, and comprises M first signal lines and N second signal lines, each of the first memristors comprises a first end and a second end; first ends of the first memristors in an m-th row are connected to an m-th first signal line, and second ends of the first memristors in an n-th column are connected to an n-th second signal line; the N second signal lines are configured to receive the plurality of initial neural signals, so that N first memristors located on a same row form a filter to extract at least one feature information of the plurality of initial neural signals, the M first signal lines are configured to output the plurality of feature information, wherein M and N are integers and are both greater than 1, m is an integer greater than or equal to 1 and less than or equal to M, and n is an integer greater than or equal to 1 and less than or equal to N.

For example, in the information processing circuit provided by at least one embodiment of the present disclosure, the signal acquisition circuit is further configured to acquire a plurality of inverse neural signals of the plurality of initial neural signals, respectively; N first memristors located on the same row are divided into a plurality of first memristor pairs, each of the first memristor pairs corresponds to one element in a coefficient vector of the filter respectively, wherein a first memristor of each first memristor pair is configured to receive an initial neural signal selected from the plurality of initial neural signals, and the other first memristor in each first memristor pair is configured to receive an inverse neural signal corresponding to the initial neural signals selected from the plurality of initial neural signals.

For example, in the information processing circuit provided by at least one embodiment of the present disclosure, different rows of first memristors in the preprocessing array are configured to extract different feature information in the plurality of feature information respectively.

For example, in the information processing circuit provided by at least one embodiment of the present disclosure, the filter is a limited impulse response filter.

For example, in the information processing circuit provided by at least one embodiment of the present disclosure, the plurality of memristors further comprise a plurality of second memristors, and the plurality of second memristors are arranged in an array to obtain a neural network array; the decoding sub-circuit comprises a conversion device and a neural network array; the conversion device is coupled with the preprocessing sub-circuit to receive the plurality of feature information and is configured to convert the plurality of feature information into a plurality of feature values, the neural network array is coupled with the converter to receive the plurality of feature values and is configured to determine the state classification corresponding to the initial neural signals according to the plurality of feature values.

For example, in the information processing circuit provided by at least one embodiment of the present disclosure, conductance values of the plurality of second memristors in the neural network array correspond to a weight matrix of a neural network, and the neural network array is configured to calculate the plurality of feature values to obtain a plurality of output values, and to determine the state classification corresponding to the initial neural signals according to the plurality of output values.

For example, in the information processing circuit provided by at least one embodiment of the present disclosure, the conversion device is further configured to obtain a plurality of opposite feature values of the plurality of feature values, respectively, a plurality of second memristors located on a same row are divided into a plurality of second memristor pairs, and each of the plurality of second memristor pairs correspond to one element in the weight matrix respectively, one second memristor of each second memristor pair is configured to receive a pulse signal of selected one feature value of the plurality of feature values, and the other second memristor in each of the second memristor pairs is configured to receive a pulse signal of an opposite feature value corresponding to the selected one feature value.

For example, in the information processing circuit provided by at least one embodiment of the present disclosure, the neural network array comprises a first neural network array and a second neural network array, the decoding sub-circuit further comprises an active sub-circuit, and the active sub-circuit is configured to map an output vector of the first neural network array to an input vector of the second neural network array.

For example, in the information processing circuit provided by at least one embodiment of the present disclosure, the feature information comprises electrical current information, and the conversion device comprises a transimpedance amplifier and a calculation circuit unit, the transimpedance amplifier is configured to convert the electrical current information into voltage information; and the calculation circuit unit is configured to perform statistics on the voltage information in a period of time to obtain the plurality of feature values.

For example, in the information processing circuit provided by at least one embodiment of the present disclosure, the signal acquisition circuit is further configured to perform bias processing on the initial neural signals, so that amplitudes of the initial neural signals are within a voltage operation range of the memristors.

At least one embodiment of the present disclosure further provides an information processing method, comprising: obtaining a plurality of initial neural signals that are different, through a signal acquisition circuit; and processing the plurality of initial neural signals by using a plurality of memristors through a signal processing circuit comprising the plurality of memristors, wherein processing the plurality of initial neural signals by using the plurality of memristors comprises: extracting the plurality of initial neural signals by using a preprocessing array to obtain a plurality of feature information, wherein the plurality of memristors comprise a plurality of first memristors, and the plurality of first memristors are arranged in an array to obtain the preprocessing array.

For example, in the information processing method provided by at least one embodiment of the present disclosure, processing the plurality of initial neural signals by using the plurality of memristors further comprises: decoding the feature information by the plurality of memristors to determine a state classification corresponding to the plurality of initial neural signals.

For example, in the information processing method provided by at least one embodiment of the present disclosure, the plurality of memristors further comprises a plurality of second memristors, and the plurality of second memristors are arranged in an array to obtain a neural network array, decoding the feature information to determine the state classification corresponding to the plurality of initial neural signals comprises: converting the plurality of feature information into a plurality of feature values; and determining the state classification corresponding to the plurality of initial neural signals by using the neural network array according to the plurality of feature values.

BRIEF DESCRIPTION OF THE DRAWINGS

In order to illustrate the technical solutions of the embodiments of the present disclosure more clearly, the following will briefly introduce the attached drawings of the embodiments. Obviously, the attached drawings in the following description merely relate to some embodiments of the present disclosure and are not a limitation of the present disclosure.

DETAILED DESCRIPTION

Figure 1:
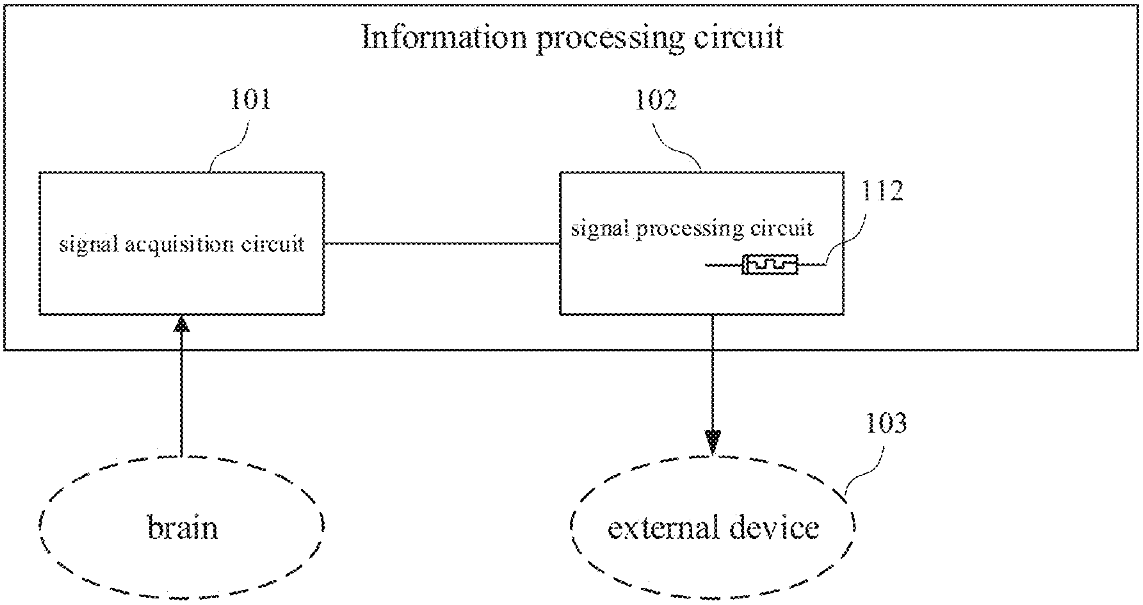
FIG. 1 shows a schematic diagram of an information processing circuit according to some embodiments.

In order to make the purpose, technical solutions and advantages of the embodiments of the present disclosure clearer, the technical solutions in the embodiments of the present disclosure will be described clearly and completely in combination with the attached drawings in the embodiments of the present disclosure. Obviously, the described embodiments are only part of the embodiments of the present disclosure, not all of them. Based on the embodiments in the present disclosure, all other embodiments obtained by the person of ordinary skill in the art without any inventive work shall fall within the protection scope of the present disclosure.

Unless otherwise defined, the technical or scientific terms used in the present disclosure shall have the usual meanings understood by those with ordinary skills in the field to which this disclosure belongs. The words "first", "second" and similar words used in the present disclosure do not mean any order, quantity, or importance, but are only used to distinguish different components. Similarly, similar words such as "including" or "comprising" mean that the elements or items appearing before the word cover the elements or items listed after the word and their equivalents, but do not exclude other elements or items. Similar words such as "connect" or "connected" are not limited to physical or mechanical connections, but may comprise an electrical connection, directly or indirectly. "On," "under," "right," "left" and the like are only used to indicate relative position relationship, and when the position of the object which is described is changed, the relative position relationship may be changed accordingly.

The memristor (resistive random-access memory, phase change memory, conductive bridge random-access memory, etc.) is a kind of non-volatile device which may adjust its conductive state by applying external excitation. According to the Kirchhoff electrical current law and the Ohm law, an array composed of such devices may perform Multiply-Accumulate calculations in parallel, and both storage and calculation occur in each device in the array. Based on this calculation architecture, the integrated calculation of storage and calculation that does not require a large amount of data transfer can be realized. Therefore, the information processing circuit may be constructed by using memristors, for example, the information processing circuit may analyze the neural signals.

At least one embodiment of the present disclosure provides an information processing circuit, the information processing circuit comprises a signal acquisition circuit and a signal processing circuit, the signal acquisition circuit is configured to acquire a plurality of initial neural signals that are different; the signal processing circuit comprises a plurality of memristors and is configured to process a plurality of initial neural signals through a plurality of memristors. The plurality of memristors comprise a plurality of first memories, the plurality of first memories are arranged in an array to obtain a preprocessing array, and the preprocessing array is configured to extract features of the plurality of initial neural signals to obtain a plurality of feature information.

At least one embodiment of the present disclosure further provides an information processing method corresponding to the information processing circuit as mentioned above.

The information processing circuit and the information processing method provided by embodiments of the present disclosure may directly receive analog signals and process the analog signals by using memristors, thus avoiding the use of a large number of analog-to-digital converters, and further reducing the required power consumption.

In the information processing circuit and the information processing method provided by some embodiments of the present disclosure, the information processing circuit comprises a memristor array, the memristor array comprises a plurality of memristors and processes the analog signals, the calculated data may be stored in the memristor array composed of a plurality of memristors in the form of analog conductance values, the memristor array combines calculation and storage, breaks through the bottleneck of the storage wall, and the memristor array has a small area and strong scalability.

FIG. 1 shows an information processing circuit. As shown in FIG. 1, the information processing circuit comprises a signal acquisition circuit 101 and a signal processing circuit 102.

The signal acquisition circuit 101 is configured to acquire a plurality of initial neural signals that are different. The signal processing circuit 102 comprises a plurality of memristors 112 and is configured to process the plurality of initial neural signals through the plurality of memristors 112. The plurality of memristors comprise a plurality of first memristors, the plurality of first memristors are arranged in an array to obtain a preprocessing array, and the preprocessing array is configured to extract features of the plurality of initial neural signals to obtain a plurality of feature information.

In an embodiment of the present disclosure, a processing result obtained by processing a plurality of initial neural signals through the signal processing circuit, for example, may be sent to an external device 103, so that the external device 103 responds to the processing result. For example, the external device 103 may display the processing result, or send a prompt message, etc., in a case that the processing result show that initial neural signals are abnormal.

In an embodiment of the present disclosure, the initial neural signals may be analog signals.

For example, in a process of signal analysis of analog signals, it is usually necessary to perform analog-to-digital conversion on the analog signals first to convert the analog signals into digital signals, and then process the digital signals to complete the analysis of the analog signals.

The information processing circuit provided by embodiments of the present disclosure may directly process initial neural signals by using a plurality of memristors, without the need to convert the initial neural signals into digital signals before processing the digital signals, thereby reducing the number of conversion of analog signals and digital signals in the process of neural signals analysis, reducing the use of analog-to-digital converters and other hardware resources, and further reducing the power consumption of the circuit.

As shown in FIG. 1, the signal acquisition circuit 101 may receive, for example, initial neural signals generated by a brain. For example, the initial neural signals may be continuous analog signals or discrete analog signals, which are not limited in the embodiments of the present disclosure. In the present disclosure, "brain" comprises and is not limited to various animal' s brain; "neural signals" comprise but are not limited to brain neural signals, spinal neural signals, etc.

For example, in some embodiments of the present disclosure, the signal acquisition circuit 101 may adopt a circuit composed of neural probes, and the neural probes may contact the brain to acquire continuous initial neural signals or discrete initial neural signals.

In some embodiments of the present disclosure, the signal acquisition circuit 101 may further be configured to amplify and bias initial neural signals, so that amplitudes of the initial neural signals are within a voltage operation range of a memristor. It should be noted that, for example, the signal acquisition circuit 101 may comprise an amplification circuit, analog-to-digital conversion circuit/digital-to-analog conversion circuit, etc., to perform bias processing. The voltage operation range of the memristor may be a voltage range in which the conductance state of the memristor does not change under the action of voltages with different amplitudes. For example, the voltage operation range may be [0, 0.3] V.

For example, the initial neural signals may be amplified and then added to a reference voltage to bias the voltage values of the initial neural signals within the voltage operation range. Alternatively, the initial neural signals may be normalized first to obtain normalized results, and then the normalized results are added to the reference voltage, thereby biasing the initial neural signals to the voltage operation range.

The information processing circuit provided by at least one embodiment of the present disclosure biases the initial neural signals to the voltage operation range of the memristor, which may at least partially avoid calculation error caused by changes in the conductance value of the memristor.

It should be noted that, the memristors in the embodiments of the present disclosure may comprise only one memristor element, or may comprise a transistor and a memristor element, or may also be other memristor structures. The embodiments of the present disclosure do not limit the structure of the memristor.

Figure 2A:
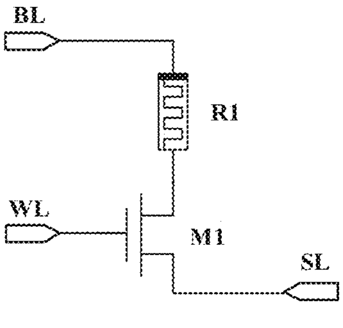
FIG. 2A shows a schematic diagram of a memristor according to some embodiments.

FIG. 2A shows a schematic diagram of a memristor. As shown in FIG. 2A, the memristor adopts a 1T1R structure, that is, the memristor comprises a transistor M1 and a memristor element R1.

It should be noted that, the transistor used in the embodiments of the present disclosure may be a thin film transistor or a field effect transistor (e.g., MOS field effect transistor) or other switching device with same characteristics. The source electrode and the drain electrode of the transistor used here may be symmetrical in structure, so there is no difference between the structure of the source electrode and the drain electrode thereof. In an embodiment of the present disclosure, in order to distinguish the two electrodes of the transistor other than the gate electrode, one is described directly as the first electrode and the other is the second electrode.

The embodiments of the present disclosure do not limit the type of the transistor used, for example, when a transistor M1 adopts a N-type transistor, the gate electrode of the transistor M1 is connected with a word line end WL, for example, when the word line end WL inputs a high level, the transistor M1 is turned on; the first electrode of the transistor M1 may be a source electrode and is configured to connect with a source line end SL, for example, the transistor M1 may receive a reset voltage through the source line end SL; the second electrode of the transistor M1 may be a drain electrode and is configured to connect with the second electrode (e.g., negative electrode) of a memristor element R1, and the first electrode (e.g., positive electrode) of the memristor element R1 is connected with a bit line end BL, for example, the memristor element R1 may receive a set voltage through the bit line end BL. For example, when the transistor M1 adopts a P-type transistor, the gate electrode of the transistor M1 is connected with the word line end WL, for example, when the word line end WL inputs a low level, the transistor M1 is turned on; the first electrode of the transistor M1 may be a drain electrode and is configured to connect with the source line end SL, for example, the transistor M1 may receive the reset voltage through the source line end SL; the second electrode of the transistor M1 may be a source electrode and is configured to connect with the second electrode (e.g., negative electrode) of the memristor element R1, and the first electrode (e.g., positive electrode) of the memristor element R1 is connected with the bit line end BL, for example, the memristor element R1 may receive the set voltage through the bit line end BL. It should be noted that, the structure of the resistive random-access memory may further be implemented as other structure, such as the structure in which the second electrode of the memristor element R1 is connected with the source line end SL, and the embodiments of the present disclosure do not limit this. The following embodiments are illustrated by taking the transistor M1 adopting the N-type transistor as an example.

The function of the word line end WL is to apply a corresponding voltage to the gate electrode of the transistor M1, so as to control the transistor M1 on or off. When operating the memristor element R1, for example, performing a set operation or a reset operation, the transistor M1 needs to be turned on first, that is, the gate electrode of the transistor M1 needs to be applied with a turn-on voltage through the word line end WL. After the transistor M1 is turned on, for example, the resistance state of the memristor element R1 may be changed by applying a voltage to the memristor element R1 through the source line end SL and the bit line end BL. For example, a set voltage may be applied through the bit line end BL, so that the memristor element R1 is in a low resistance state; for another example, a reset voltage may be applied through the source line end SL, so that the memristor element R1 is in a high resistance state.

It is to be noted that, in an embodiment of the present disclosure, by applying voltages to the word line end WL and the bit line end BL at the same time, the resistance value of the memristor element R1 becomes smaller and smaller, that is, the memristor element R1 changes from the high resistance state to the low resistance state, and the operation of changing the memristor element from the high resistance state to the low resistance state is called the set operation; by applying voltages to the word line end WL and the source line end SL at the same time, the resistance value of the memristor element R1 becomes larger and larger, that is, the memristor element R1 changes from the low resistance state to the high resistance state, and the operation of changing the memristor element R1 from the low resistance state to the high resistance state is called the reset operation. For example, the memristor element R1 has a threshold voltage, and the resistance value (or conductance value) of the memristor element R1 is not changed when the input voltage amplitude is less than the threshold voltage of the memristor element R1. In this case, the resistance value (or conductance value) of the memristor element R1 may be used for calculation by inputting a voltage less than the threshold voltage; the resistance value (or conductance value) of the memristor element R1 may be changed by inputting a voltage greater than the threshold voltage.

In an embodiment of the present disclosure, a plurality of memristors 112 in the signal processing circuit 102 may be arranged in an array, thereby the initial neural signals may be processed by the plurality of memristors 112 arranged in the array. In an embodiment of the present disclosure, a plurality of memristors comprise a plurality of first memristors, and the plurality of first memristors are arranged in an array to obtain a preprocessing array. The preprocessing array may be, for example, M rows*N columns of memristor array. For example, the preprocessing array may be used to extract the features of a plurality of initial neural signals to obtain a plurality of feature information. For another example, the plurality of memristors 112 may identify the state classification of the initial neural signals, determine the corresponding brain state, or may also perform regression analysis on the initial neural signals and the corresponding continuous physical quantities, such as the speed of hand movement, the direction angle of the manipulator's movement, etc.

Figure 2B:
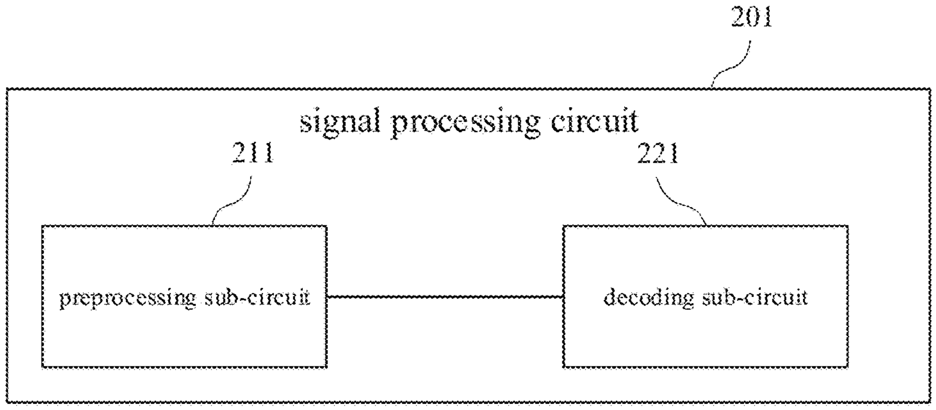
FIG. 2B shows an information processing circuit according to some embodiments.

FIG. 2B shows a signal processing circuit. In at least one embodiment of the present disclosure, as shown in FIG. 2B, the signal processing circuit 201 comprises a preprocessing sub-circuit 211 and a decoding sub-circuit 221. The decoding sub-circuit 221 may be coupled with the preprocessing sub-circuit 211.

For example, the preprocessing sub-circuit comprises a preprocessing array, the preprocessing sub-circuit may be obtained by arranging a plurality of first memristors in a plurality of memristors 112 in an array, and the plurality of first memristors are part or all of the plurality of memristors 112. The preprocessing array is configured to extract the features of a plurality of initial neural signals to obtain a plurality of feature information.

In an embodiment of the present disclosure, the preprocessing array may, for example, extract the features of the initial neural signals, for example, filtering or Fourier transform may be used to extract the feature information of the initial neural signals. Feature information may be, for example, a plurality of electrical current values output after the preprocessing array performs different calculations on the plurality of initial neural signals, respectively.

In an embodiment of the present disclosure, the preprocessing sub-circuit may further comprise a buffer or a switch, so as to select a plurality of initial neural signals applied to the preprocessing array from a large number of initial neural signals output by the signal acquisition circuit.

The decoding sub-circuit is configured to decode a plurality of feature information to determine a state classification corresponding to the plurality of initial neural signals.

The decoding process comprises, for example, converting the feature information into pulse signals, and performing calculation on the pulse signals by using an artificial neural network or a support vector machine.

The state classification may be determined by those skilled in the art according to the actual situation and experience. For example, in the application scenario of analyzing the state of a brain nervous system, the state classification of the initial neural signals comprises normal, interictal and ictal.

The exemplary preprocessing array in the embodiments of the present disclosure is illustrated below with reference to FIG. 3 and FIG. 4.

Figure 3:
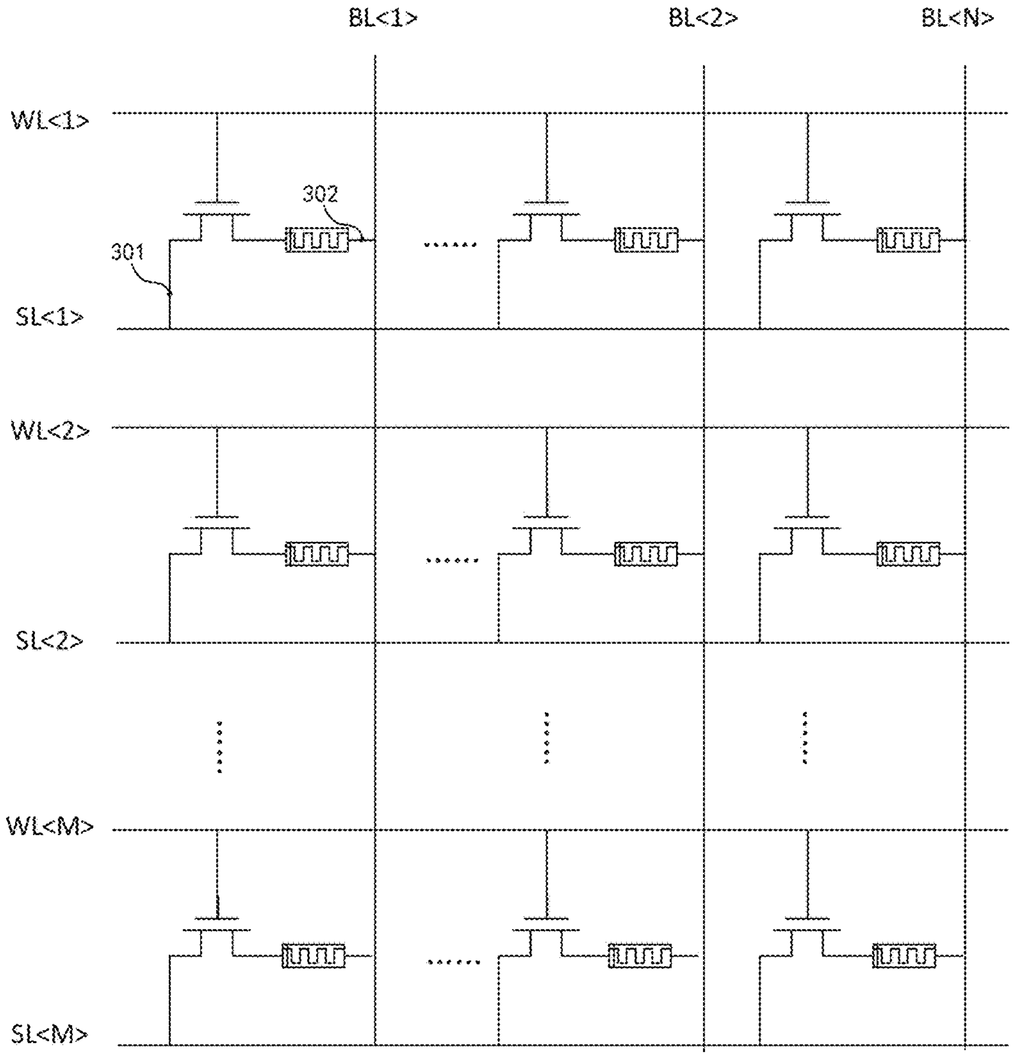
FIG. 3 shows a schematic diagram of a memristor array according to some embodiments.

FIG. 3 shows a memristor array, and the memristor array may be, for example, a preprocessing array. The preprocessing array comprises M rows*N columns of first memristors, M first signal lines (SL<1>, SL<2> . . . SL<M>), and N second signal lines (BL<1>, BL<2> . . . BL<N>). The first memristor may, for example, adopt a memristor structure as shown in FIG. 2A. Where M is an integer greater than 1 and N is an integer greater than or equal to 1.

As shown in FIG. 3, each first memristor comprises a first end 301 and a second end 302. The first end 301 of the first memristor in the m-th row is connected to the m-th first signal line, and the second end 302 of the first memristor in the n-th column is connected to the n-th second signal line. m is an integer greater than or equal to 1 and less than or equal to M, and n is an integer greater than or equal to 1 and less than or equal to N. The first signal line is, for example, a source line, and the second signal line is, for example, a bit line.

In FIG. 3, BL<1>, BL<2> . . . BL<N> represent the bit line of the first column, the bit line of the second column, . . . the bit line of the N-th column, respectively, and the first memristors of each column are connected with the corresponding bit line of the column. SL<1>, SL<2> . . . SL<M> represent the source line of the first row, the source line of the second row, . . . the source line of the M-th row, respectively, and the first memristors in each row are connected with the corresponding source line of the row; in FIG. 3, WL<1>, WL<2> . . . WL<M> represent the word line of the first row, the word line of the second row, . . . the word line of the M-th row, respectively.

In this embodiment, for example, the drain electrodes of the transistors of the first memristors in each row may be connected with the source line corresponding to the row, and the gate electrodes of the transistors of the first memristors in each row may be connected with the word line corresponding to the column.

In this embodiment, N second signal lines are used to receive a plurality of initial neural signals, and N first memristors in the same row form a filter to extract at least one feature information of the plurality of initial neural signals; M first signal lines are used for outputting a plurality of feature information.

Figure 4:
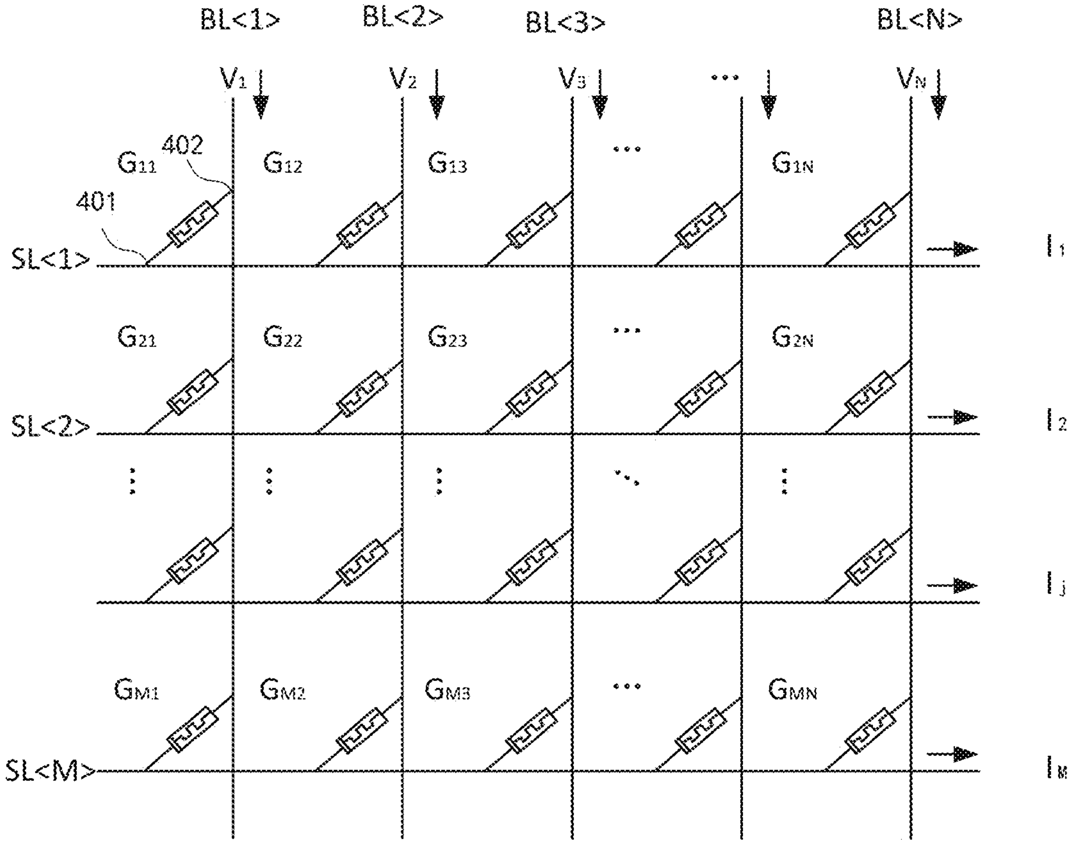
FIG. 4 shows a schematic diagram of another memristor array.

FIG. 4 shows another memristor array, which may further be used as a preprocessing array. The preprocessing array comprises M rows*N columns of first memristors, M first signal lines, and N second signal lines. For example, the first memristor may adopt a structure comprising only the memristor element R1. M is an integer greater than 1, and N is an integer greater than or equal to 1.

In FIG. 4, BL<1>, BL<2> . . . BL<N> represent the bit line of the first column, the bit line of the second column, . . . the bit line of the N-th column, respectively. SL<1>, SL<2> . . . SL<M> represent the source line of the first row, the source line of the second row, . . . the source line of the M-th row, respectively.

Each first memristor comprises a first end and a second end, the first end 401 of the first memristor in the m-th row is connected to the m-th first signal line, and the second end 402 of the first memristor in the n-th column is connected to the n-th second signal line. For example, the first signal line may be a source line, and the second signal line may be a bit line. As shown in FIG. 4, the first memristors of each column are connected with the bit line corresponding to the column, and the first memristors in each row are connected with the source line corresponding to the row. m is an integer greater than or equal to 1 and less than or equal to M, and n is an integer greater than or equal to 1 and less than or equal to N.

It should be noted that, the preprocessing array shown in FIG. 3 and FIG. 4 is only an example, and the embodiments of the present disclosure include but are not limited to this, for example, it is further possible to connect the first end of the first memristor to the bit line and connect the second end of the first memristor to the source line.

In an embodiment of the present disclosure, N second signal lines are used to receive a plurality of initial neural signals, so that N first memristors in the same row form a filter to extract at least one feature information of the plurality of initial neural signals, and M first signal lines are used to output a plurality of feature information.

In an embodiment of the present disclosure, the filter is, for example, a finite impulse response filter, for example, a plurality of finite impulse response filters may form a finite impulse response filter bank. The input-output relationship of the finite impulse response filter bank may be expressed by the following formula (1):

$$y^m(n) = \sum_{k=0}^{K} x(n-k)h^m(k),\ (m = 1, 2, \ldots , M) \tag{1}$$

In formula (1), m represents the serial number of the filter, M represents the total number of the filters, K represents the order of the filters, x is the input signal vector, y is the output signal vector, and $h^m(k)$ represents the coefficient vector of the m-th filter. For example, n may represent a certain moment.

The information processing circuit provided by the embodiments of the present disclosure may make use of the characteristic that the memristor may carry out the Multiply-Accumulate calculation, and form a filter with first memristors in the same row or column to extract the feature information, therefore, a complex filter circuit is not needed, and filtering may be realized directly by an array composed of memristors, such as the preprocessing array in the embodiments of the present disclosure.

The principle of using the preprocessing array to filter the initial neural signals will be explained below with reference to FIG. 4.

As shown in FIG. 4, for example, a plurality of initial neural signals are applied to N second signal lines, respectively, the first memristors in the same column receive the same initial neural signal, and the first memristors in different columns receive different initial neural signals.

According to the Kirchhoff law, the output electrical current of the preprocessing array may be obtained according to the following formula (2):

$$I_j = \sum_{k=1}^{N} G_{jk} V_k \tag{2}$$

-continued where $j = 1, \ldots, M, k = 1, \ldots, N.$

In the above formula (2), $V_k$ represents a voltage input on the k-th signal line among a plurality of second signal lines, and $I_j$ represents an electrical current output on the j-th signal line among a plurality of first signal lines. $G_{jk}$ represents the conductance value of the first memristor located in the j-th row and the k-th column. According to an embodiment of the present disclosure, a vector composed of the conductance values $G_{jk}$ of N first memristors corresponding to the m-th filter may be used as the coefficient vector $h^m(k)$ of the filter.

According to the characteristics of the memristor described above, for example, the conductance value of the memristor may be changed by applying a set voltage or a reset voltage to the memristor through the source line end SL and the bit line end BL, so that each memristor may have a different conductance value, that is, the coefficient vector of the filter is changed by changing the conductance value of the memristor, so that a filter that meets filtering requirements is designed.

According to the Kirchhoff law, the memristor array may perform Multiply-Accumulate calculations in parallel.

In some embodiments of the present disclosure, one element in a coefficient vector of a filter may be implemented by two first memristors. For example, N first memristors in the same row are divided into a plurality of first memristor pairs, each first memristor pair corresponds to one element in the coefficient vector of the filter, respectively. For example, each first memristor pair comprises two memristors, for example, the two memristors are arranged directly adjacent to each other in the memristor array; for another example, one first memristor in each first memristor pair is used to receive one initial neural signal selected from a plurality of initial neural signals, and the other first memristor in the first memristor pair is used to receive an inverse neural signal corresponding to the initial neural signal selected above.

Accordingly, in this embodiment, the signal acquisition circuit 101 is further configured to acquire a plurality of inverse neural signals of a plurality of initial neural signals, respectively.

In some embodiments of the present disclosure, using a first memristor pair composed of two first memristors to correspond to one element in a coefficient vector of a filter may make the coefficient vector comprise negative values, so that more abundant and complex filters may be realized by using a plurality of first memristors.

Figure 5:
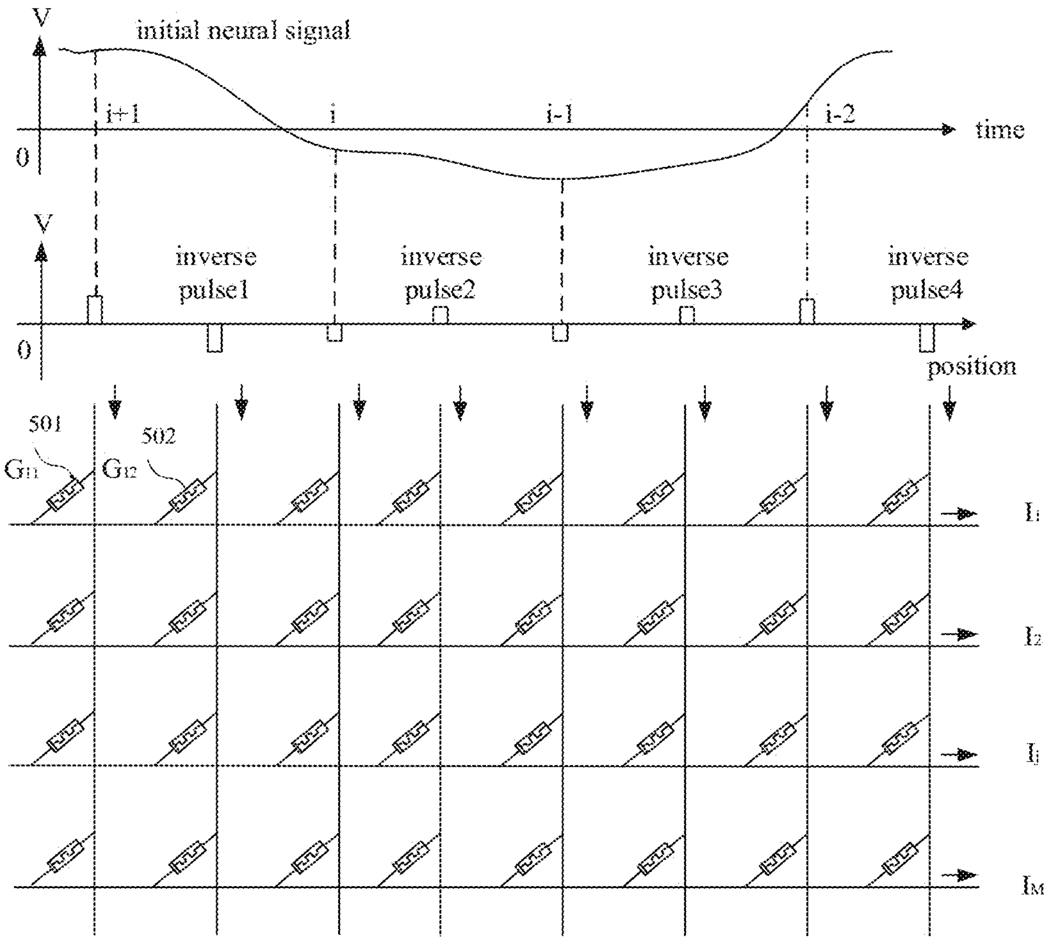
FIG. 5 shows a schematic diagram of applying initial neural signals and inverse neural signals to a plurality of first memristors according to some embodiments.

FIG. 5 shows a schematic diagram of applying initial neural signals and inverse neural signals to a plurality of first memristors according to an embodiment of the present disclosure.

As shown in FIG. 5, the signal acquisition circuit 101 may acquire, for example, continuous initial neural signals generated by a brain. For example, the initial neural signals may further be pulse signals.

In an embodiment of the present disclosure, for example, continuous initial neural signals may be sampled to obtain discrete initial neural signals at different time points. As shown in FIG. 5, for example, the initial neural signal at time point i+1, the initial neural signal at time point i, the initial neural signal at time point i−1, and the initial neural signal at time point i−2 may be obtained by sampling from the continuous initial neural signals.

In an embodiment of the present disclosure, for example, two first memristors adjacent to each other in the same row form a first memristor pair.

Then, the signal acquisition circuit 101 may acquire a plurality of inverse neural signals of a plurality of initial neural signals (i.e., the initial neural signal at time point i+1, the initial neural signal at time point i, the initial neural signal at time point i−1, and the initial neural signal at time point i−2), respectively. For example, the inverse neural signal of the initial neural signal at time point i+1 may be inverse pulse 1, the inverse neural signal of the initial neural signal at time point i may be inverse pulse 2, the inverse neural signal of the initial neural signal at time point i−1 may be inverse pulse 3, and the inverse neural signal of the initial neural signal at time point i−2 may be inverse pulse 4.

As shown in FIG. 5, for example, the first memristor 501 and the first memristor 502 may form a first memristor pair, the conductance value of the first memristor 501 is expressed as $G_{11}$, and the conductance value of the first memristor 502 is expressed as $G_{12}$. The first memristor 501 receives the initial neural signal at time point i+1, the initial neural signal at time point i+1 is represented as, for example, $V_{i+1}$, and the first memristor 502 receives the inverse neural signal of $V_{i+1}$, namely, $-V_{i+1}$. The result of Multiply-Accumulate calculation of the first memristor 501 and the first memristor 502 is $V_{i+1}*G_{11}+(-V_{i+1})*G_{12}$, that is, $V_{i+1}*(G_{11}-G_{12})$. Therefore, the first memristor pair composed of the first memristor 501 and the first memristor 502 may correspond to one element in a coefficient vector of a filter. In this embodiment, the element is $G_{11}-G_{12}$.

In an embodiment of the present disclosure, the first memristors in each row of the preprocessing array are used to extract different feature information from a plurality of feature information, respectively. In this way, different feature information be obtained simultaneously through parallel calculations of the preprocessing array, which improves the computational efficiency and may obtain more feature information.

For example, as shown in FIG. 5, a filter composed of eight first memristors in the first row is used to acquire a δ wave (0.5 Hz-4 Hz) component in the initial neural signal, a filter composed of eight first memristors in the second row is used to acquire a θ wave (4 Hz-8 Hz) component in the initial neural signal, a filter composed of eight first memristors in the third row is used to acquire an a wave (8 Hz-12 Hz) component in the initial neural signal, and a filter composed of eight first memristors in the fourth row is used to acquire a β wave (12 Hz-30 Hz) component in the initial neural signal.

It is to be noted that, in the above description, the principle of filtering the initial neural signals by the preprocessing array is illustrated by taking a case that the filter is a finite impulse response filter as an example, but the present disclosure does not limit the filter to the finite impulse response filter. Those skilled in the art may use a plurality of memristor arrays to design different filters according to actual needs, for example, the filter may also be an infinite impulse response filter, etc.

In some embodiments of the present disclosure, a plurality of memristors further comprise a plurality of second memristors, and the plurality of second memristor are arranged in an array to obtain a neural network array, for example, the plurality of second memristors are part or all of the plurality of memristors.

For example, in some embodiments, a plurality of memristors comprise a plurality of first memristors and a plurality of second memristors, respectively, the plurality of first memristors are arranged in an array to obtain the preprocessing array, and the plurality of second memristors are arranged in an array to obtain a neural network array.

The decoding sub-circuit comprises a conversion device and a neural network array. The conversion device is coupled with the preprocessing sub-circuit to receive a plurality of feature information and is configured to convert the plurality of feature information into a plurality of feature values.

For example, the feature information comprises electrical current information, and the conversion device comprises a transimpedance amplifier and a calculation circuit unit. The transimpedance amplifier is configured to convert the electrical current information into the voltage information, and the calculation circuit unit is configured to obtain a plurality of feature values by counting the voltage information within a period of time.

Referring to the embodiment of FIG. 5 described above, the preprocessing array comprises four third-order filters, that is, eight first memristors in the first row compose the first filter, eight first memristors in the second row compose the second filter, eight first memristors in the third row compose the third filter, and eight first memristors in the fourth row compose the fourth filter. For example, at time point t, the output of the first filter may be the output electrical current of the δ wave (0.5 Hz-4 Hz) component in the initial neural signal at time point t, the output of the second filter may be the output electrical current of the θ wave (4 Hz-8 Hz) component in the initial neural signal at time point t, the output of the third filter may be the output electrical current of the α wave (8 Hz-12 Hz) component in the initial neural signal at time point t, and the output of the fourth filter may be the output electrical current of the β wave (12 Hz-30 Hz) component in the initial neural signal at time point t.

In an embodiment of the present disclosure, the transimpedance amplifier is, for example, coupled with the preprocessing sub-circuit to receive the output electrical current of each row, and convert the output electrical current of each row into voltage information. Then the voltage information within a period of time is counted through the calculation circuit unit to obtain a plurality of feature values.

For example, the maximum amplitude value, minimum amplitude value, average value, sum of absolute values and sum of squares of the respective voltages of δ wave component, θ wave component, α wave component, and β wave component from time point $t_1$ to time point $t_2$ may be counted. In this embodiment, the output of the preprocessing sub-circuit may be 20 feature values.

For example, a neural network array is coupled with a conversion device to receive a plurality of feature values, and the state classification corresponding to a plurality of initial neural signals may be determined according to the plurality of feature values.

In at least one embodiment of the present disclosure, the input-output relationship of the single-layer artificial neural network may be expressed by the following formula (3):

$$Y = X_C^T W_C + B = X_a^T W_a \quad (3)$$

where $X_C$ represents an initial input vector and B is a fixed bias. $X_a$ represents a final input vector obtained after adding the fixed bias to $X_C$, $W_a$ represents a weight matrix obtained after adding the fixed bias to $W_C$, and Y represents a output vector.

For example, $X_C=[X_1, X_2, X_3, \ldots, X_{20}]^T$, $Xa=[X_1, X_2, X_3, \ldots, X_{21}]^T$, $Wc=[W_{1,1}, W_{1,2}, W_{1,3} \ldots, W_{1,20}; W_{2,1}, W_{2,2}, \ldots, W_{2,20}; W_{3,1}, W_{3,2} \ldots W_{3,20}, \ldots]^T$, $Wa=[W_{1,1}, W_{1,2}, W_{1,3} \ldots, W_{1,21}; W_{2,1}, W_{2,2} \ldots, W_{2,21}; W_{3,1}, W_{3,2} \ldots W_{3,21}; \ldots]^T$, $B=[b_1, b_2, b_3]^T$, $Y=[y_1, y_2, y_3]^T$, and $X_{21}=1$.

When training the neural network model, for example, $X_{1\text{-}20}$ and $X_{21}=1$ of the training set and corresponding Y may be used for training to obtain the weight matrix Wa.

It should be noted that, the above taking a case that uses 20 inputs (i.e., $X_1, X_2, X_3, \ldots, X_{20}$) as an example to illustrate the training model of a single-layer artificial neural network, but the number of inputs is not limited in the embodiments of the present disclosure. Those skilled in the art may determine the number of inputs used in the training neural network model according to the actual number of feature values.

In practical applications, for example, $X_{1\text{-}21}$ may be normalized and/or amplified and biased, so that the input feature values are within the voltage operation range of the memristor. For example, $X_{21}=1$ may be normalized and amplified and biased to between 0.1V and 0.3V.

In some embodiments of the present disclosure, for example, the conductance values of a plurality of second memristors in the neural network array correspond to the weight matrix of the neural network obtained in advance, the neural network array is configured to calculate the plurality of feature values to obtain a plurality of output values, and to determine the state classification corresponding to the plurality of initial neural signals according to the plurality of output values. For example, in the embodiments described above, the conductance values of the plurality of second memristors may be used to correspond to the weight matrix Wa of the neural network. For example, the neural network array calculates the maximum amplitude value, minimum amplitude value, average value, sum of absolute values, and sum of squares of the respective voltages of δ wave component, θ wave component, α wave component, and β wave component of the plurality of feature values and $X_{21}=0.3$, to obtain the plurality of output values. Next, the state classification corresponding to the initial neural signals may be determined by comparing the sizes of the plurality of output values, for example, the state classification with the maximum output value is the state classification corresponding to the initial neural signals.

Figure 6:
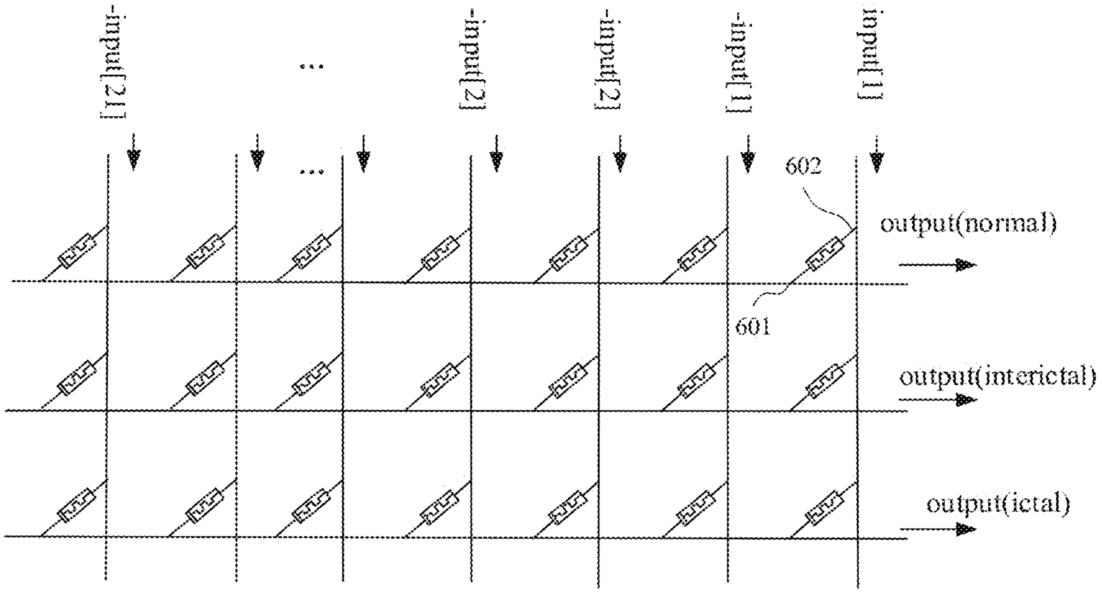
FIG. 6 shows a schematic diagram of a neural network array according to some embodiments.

FIG. 6 shows a schematic diagram of a neural network array provided by at least one embodiment of the present disclosure.

As shown in FIG. 6, the neural network array comprises P rows*Q columns of second memristors, P third signal lines and Q fourth signal lines. P is an integer greater than 1 and Q is an integer greater than or equal to 1.

As shown in FIG. 6, each second memristor comprises the first end 601 and the second end 602. The first ends 601 of the second memristors located in the p-th row are connected to the p-th third signal line, and the second ends 602 of the second memristors in the q-th column are connected to the q-th fourth signal line. p is an integer greater than or equal to 1 and less than or equal to P, and q is an integer greater than or equal to 1 and less than or equal to Q. The third signal line is, for example, a source line, and the fourth signal line is, for example, a bit line.

As shown in FIG. 6, for example, P equals 3 and Q equals 42. In this embodiment, 42 fourth signal lines are used to receive the plurality of feature values. 3 third signal lines are used to output the Multiply-Accumulate result calculated by the second memristors in each row.

In an embodiment of the present disclosure, for example, the output of each row represents a state classification. For example, in an application scenario for analyzing the state of the brain nervous system, for example, the output of the first row, the output of the second row and the output of the third row respectively represent the probability that the initial neural signals are the normal signals, the probability that the initial neural signals are the interictal signals and the probability that the initial neural signals are the ictal signals.

It should be noted that, the neural network array shown in FIG. 6 is only an example, and embodiments of the present disclosure comprise, but are not limited to this. For example, the first end of the second memristor is connected to a bit line, and the second end is connected to a source line.

In some embodiments of the present disclosure, the conversion device in the decoding sub-circuit is further configured to obtain the inverse feature values of the plurality of feature values. In this embodiment, the plurality of second memristors located in the same row are divided into a plurality of second memristor pairs, each second memristor pair corresponds to one element in the weight matrix. For example, one second memristor in each second memristor pair is used to receive a pulse signal of one selected feature value of a plurality of feature values, and the other second memristor in the second memristor pair is used to receive a pulse signal of the inverse feature value corresponding to the selected one feature value.

For example, in the neural network array shown in FIG. 6, odd-numbered columns may receive a pulse signal of a feature value, respectively, and even-numbered columns may receive a pulse signal of an inverse feature value corresponding to the feature value, respectively.

In some embodiments of the present disclosure, using the second memristor pair composed of two second memristors to correspond to one element in the weight matrix of the neural network may make the weight matrix comprise negative values, so that a plurality of second memristors may be used to realize a richer and more complex weight matrix in the neural network. For example, two second memristors in each second memristor pair are arranged directly adjacent to each other in the array.

In some embodiments of the present disclosure, the neural network array may further be used to implement a weight matrix in a multi-layer neural network, for example, the neural network array comprises a first neural network array and a second neural network array. For example, the decoding sub-circuit further comprises an activation sub-circuit and the activation sub-circuit is configured to map an output vector of the first neural network array to an input vector of the second neural network array. In the embodiments of the present disclosure, the recognition accuracy of the initial neural signals may be improved by using the multi-layer neural network.

In an embodiment of the present disclosure, the activation sub-circuit may be implemented by a CMOS circuit or memristors, for example. The activation sub-circuit may implement the function of the activation function $y=f(x)$, and f is a nonlinear function, that is, an input x is converted to an output y by the activation function $y=f(x)$. In a case where the output vector of the first neural network array is input to the activation sub-circuit, the activation sub-circuit may map the output vector of the first neural network array to the input vector of the second neural network array.

For example, the information processing circuit provided by at least one embodiment of the present disclosure may be used to monitor the brain state of an epileptic patient. Epilepsy is a common nervous system disease, which seriously affects the life quality of patients. It is important to efficiently distinguish the states of neural signals related to epilepsy in portable health monitoring and the like.

Figure 7:
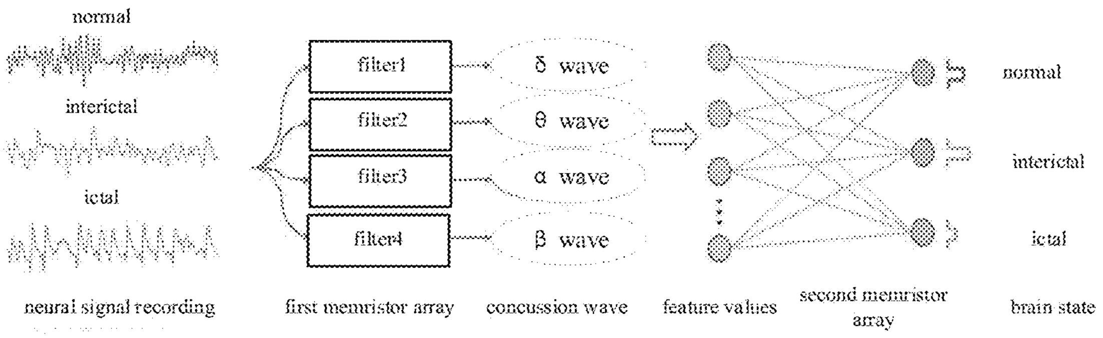
FIG. 7 shows a flow diagram of filtering and classifying epilepsy related neural signals with a memristor array according to some embodiments.

FIG. 7 shows a flow diagram of filtering and classifying neural signals related to epilepsy with a memristor array. The embodiments of the present disclosure are not limited to processing neural signals related to epilepsy.

As shown in FIG. 7, the flow mainly comprises two parts: the filtering of filter bank based on the memristor array and the classification of the artificial neural network.

A plurality of initial neural signals recorded may be sent to the first memristor array, and the first memristor array filters the plurality of initial neural signals.

The first memristor array, for example, may adopt the structure shown in FIG. 4, for example, it may comprise four filters. The four filters are used to filter the analog neural signals to obtain the components of concussion wave band which may reflect epilepsy-related brain states, respectively. For example, the four components may be the δ wave (0.5 Hz-4 Hz) component, the θ wave (4 Hz-8 Hz) component, the α wave (8 Hz-12 Hz) component, and the β wave (12 Hz-30 Hz) component, respectively.

Then, the feature information of the four components may be counted, and the feature value of each component obtained by statistics may be input into the second memristor array. The feature value of each component, for example, may comprise the maximum amplitude value of the component, the minimum amplitude value of the component, the average value of the component, sum of absolute values of the component, and sum of squares of the component.

The second memristor array is, for example, the neural network array in the above embodiments, and is used to perform calculation on the feature values based on the neural network, so as to determine the state classification of the initial neural signal and complete the classification of the initial neural signal.

In at least one embodiment of the present disclosure, a plurality of memristors in the signal processing circuit may have a relatively linear current-voltage relationship. The linear current-voltage relationship of the memristor may ensure that the conductive state of the memristor does not change under the action of voltage values with different amplitudes. For example, a plurality of memristors in the signal processing circuit present a linear current-voltage relationship between 0V and 0.3V. The linear current-voltage relationship of the memristor may ensure that, when the voltage is applied to the memristor, the conductive state of the memristor does not change, thereby reducing calculation errors, reducing the use of analog-to-digital converters, and realizing that the analog input voltage may be directly applied to the memristor.

As shown in FIG. 7, the state classification of epileptic patients may comprise normal, interictal and ictal.

Figure 8:
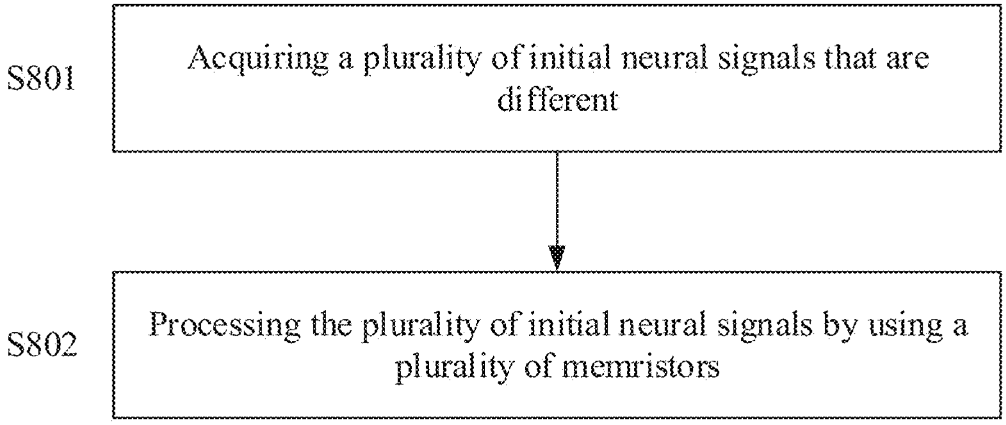
FIG. 8 shows an information processing method according to some embodiments.

At least one embodiment of the present disclosure further discloses an information processing method, for example, as shown in FIG. 8, the information processing method comprises the following steps.

Step S801: acquiring a plurality of initial neural signals that are different.

Step S802: processing the plurality of initial neural signals by using a plurality of memristors.

processing the plurality of initial neural signals by using a plurality of memristors, comprises: extracting features from the plurality of initial neural signals by using a preprocessing array to obtain a plurality of feature information, and the plurality of memristors comprise a plurality of first memristors, and the plurality of first memristors are arranged in an array to obtain the preprocessing array.

For example, the information processing method may be applied to the information processing circuit described above with reference to FIG. 1. In step S801, for example, initial neural signals produced by a brain may be received by the signal acquisition circuit 101 in the information processing circuit. For example, the signal acquisition circuit 101 comprises neural probes, and the neural probes contact the brain to acquire continuous initial neural signals or discrete initial neural signals.

The signal acquisition circuit 101 may further perform bias processing on the initial neural signals, so that the amplitudes of the initial neural signals are within the voltage operation range of the memristor.

In step S802, for example, a plurality of memristors may be used to perform filter and Fourier transform on a plurality of initial neural signals, and then perform calculations or regression analysis based on neural networks on the filtered and/or Fourier transformed signals.

The preprocessing array, for example, may be the memristor array shown above with reference to FIG. 3 and FIG. 4.

With reference to the embodiments described in FIG. 1-FIG. 7, various embodiments of the information processing method of the present disclosure are briefly described, for details, reference may be made to the previous description.

For example, the information processing circuit may comprise a preprocessing sub-circuit and a decoding sub-circuit. The preprocessing sub-circuit comprises a preprocessing array. Feature extraction is performed on a plurality of initial neural signals through the preprocessing array to obtain a plurality of feature information. The decoding sub-circuit is coupled with the preprocessing sub-circuit to perform decoding processing on a plurality of feature information to determine the state classification corresponding to the plurality of initial neural signals.

In some embodiments of the present disclosure, for example, using a plurality of memristors to process the initial neural signals further comprises: using the plurality of memristors to perform decoding processing on the feature information to determine the state classification corresponding to the initial neural signals. For example, the state classification of the initial neural signals may be identified by using the neural network array described above with reference to FIG. 6.

For example, the preprocessing array may be a memristor array described above with reference to FIG. 3 or FIG. 4. As shown in FIG. 3 or FIG. 4, the preprocessing array may comprise M rows*N columns of first memristors, and M first signal lines and N second signal lines, each first memristor comprises a first end and a second end. The first ends of the first memristors in the m-th row are connected to the m-th first signal line, and the second ends of the first memristors in the n-th column are connected to the n-th second signal line. N second signal lines are used to receive a plurality of initial neural signals, so that N first memristors in the same row form a filter to extract at least one feature information of a plurality of initial neural signals, and M first signal lines are used to output the plurality of feature information. M and N are integers greater than 1, m is an integer greater than or equal to 1 and less than or equal to M, and n is an integer greater than or equal to 1 and less than or equal to N.

In an embodiment of the present disclosure, for example, referring to FIG. 5 above, the signal acquisition circuit may further be configured to acquire a plurality of inverse neural signals of the plurality of initial neural signals; N first memristors in the same row are divided into a plurality of first memristor pairs, and the plurality of first memristor pairs correspond to one element in the coefficient vector of the filter, respectively. In this case, the information processing method provided by the embodiment of the present disclosure further comprises: receiving a selected one initial neural signal of the plurality of initial neural signals through one first memristor in each first memristor pair, and receiving a corresponding inverse neural signal of the selected one initial neural signal through the other first memristor in the first memristor pair.

For example, the first memristors in each row of the preprocessing array are used to extract different feature information from a plurality of feature information, respectively.

For example, the filter is a finite impulse response filter.

For another example, in some embodiments of the present disclosure, a plurality of memristors further comprise a plurality of second memristors, and the plurality of second memristor are arranged in an array to obtain a neural network array. In this case, decoding the feature information to determine the state classification corresponding to the plurality of initial neural signals, comprises: converting a plurality of feature information into a plurality of feature values, and using the neural network array to determine the state classification corresponding to the plurality of initial neural signals according to the plurality of feature values.

For example, the decoding sub-circuit comprises a conversion device and a neural network array. The conversion device is coupled with the preprocessing sub-circuit to receive a plurality of feature information and convert the plurality of feature information into the plurality of feature values.

For example, the conductance values of the plurality of second memristors in the neural network array correspond to a weight matrix of a neural network, the neural network array calculates a plurality of feature values to obtain a plurality of output values and determines the state classification corresponding to the initial neural signals according to the plurality of output values.

For example, the conversion device is further configured to acquire a plurality of inverse feature values of a plurality of feature values, a plurality of second memristors located in the same row are divided into a plurality of second memristor pairs, and the plurality of second memristor pairs correspond to one element in a weight matrix, respectively. In this case, the information processing method provided by the embodiments of the present disclosure further comprises: receiving the pulse signal of the selected one feature value of a plurality of feature values through one second memristor in each second memristor pair, and receiving the pulse signal of the inverse feature value corresponding to the selected one feature value through the other second memristor in the second memristor pair.

For example, the neural network array comprises a first neural network array and a second neural network array, and the decoding sub-circuit further comprises an activation sub-circuit. In this case, the information processing method provided by the embodiments of the present disclosure further comprises: mapping the output vector of the first neural network array to the input vector of the second neural network array through the activation sub-circuit.

For example, the feature information comprises electrical current information, and the conversion device comprises a transimpedance amplifier and a calculation circuit unit. In this case, the information processing method provided by the embodiments of the present disclosure further comprises: converting the electrical current information to the voltage information through the transimpedance amplifier, and obtaining the plurality of feature values by the calculation circuit unit counting the voltage information within a period of time.

For the present disclosure, there are following points to be explained:

(1) In the attached drawings of the embodiments of the present disclosure, only the structures related to the embodiments of the present disclosure are concerned, and other structures may refer to the general design.

(2) In the case of no conflicts, the features in the same embodiments and different embodiments of the present disclosure may be combined with each other.

The above are only specific embodiments of the present disclosure, but the protection scope of the present disclosure is not limited to this. Any person skilled in the art may easily think of changes or substitutions within the technical scope disclosed in the present disclosure, and the changes or substitutions shall be covered within the protection scope of the present disclosure. Therefore, the protection scope of the present disclosure should be subject to the protection scope of the claims.

What is claimed is:

1. An information processing circuit, comprising:

a signal acquisition circuit which is configured to acquire a plurality of initial neural signals that are different; and a signal processing circuit which comprises a plurality of memristors and is configured to process the plurality of initial neural signals through the plurality of memristors, wherein the plurality of memristors comprises a plurality of first memristors, the plurality of first memristors are arranged in an array to obtain a preprocessing array, the preprocessing array is configured to extract features of the plurality of initial neural signals to obtain a plurality of feature information;

wherein the preprocessing array comprises M rows*N columns of the first memristors, and comprises M first signal lines and N second signal lines, each of the first memristors comprises a first end and a second end;

first ends of the first memristors in an m-th row are connected to an m-th first signal line, and second ends of the first memristors in an n-th column are connected to an n-th second signal line;

the N second signal lines are configured to receive the plurality of initial neural signals, so that N first memristors located on a same row form a filter to extract at least one feature information of the plurality of initial neural signals, the M first signal lines are configured to output the plurality of feature information, wherein M and N are integers and are both greater than 1, m is an integer greater than or equal to 1 and less than or equal to M, and n is an integer greater than or equal to 1 and less than or equal to N;

wherein the signal acquisition circuit is further configured to acquire a plurality of inverse neural signals of the plurality of initial neural signals, wherein the plurality of initial neural signals are a plurality of initial neural pulse signals, the plurality of inverse neural signals are pulse signals and correspond to the plurality of initial neural pulse signals one by one, an absolute value of an amplitude of each inverse neural signal is equal to an absolute value of an amplitude of a corresponding initial neural signal, and a polarity of each inverse neural signal is opposite to a polarity of the corresponding initial neural signal;

the N first memristors located on the same row are divided into a plurality of first memristor pairs, each of the first memristor pairs corresponds to one element in a coefficient vector of the filter respectively, and each of the first memristor pairs comprises two first memristors that are different, wherein a first memristor of each first memristor pair is configured to receive an initial neural signal selected from the plurality of initial neural signals, and the other first memristor in each first memristor pair is configured to receive an inverse neural signal corresponding to the initial neural signal selected from the plurality of initial neural signals;

in a process of processing the plurality of initial neural signals through the plurality of memristors, conductance values of the plurality of memristors are unchanged.

2. The information processing circuit according to claim 1, wherein the signal processing circuit comprises a preprocessing sub-circuit and a decoding sub-circuit;

the preprocessing sub-circuit comprises the preprocessing array;

the decoding sub-circuit is coupled with the preprocessing sub-circuit and configured to decode the plurality of feature information to determine a state classification corresponding to the plurality of initial neural signals.

3. The information processing circuit according to claim 2, wherein the plurality of memristors further comprise a plurality of second memristors, and the plurality of second memristors are arranged in an array to obtain a neural network array;

the decoding sub-circuit comprises a conversion device and a neural network array;

the conversion device is coupled with the preprocessing sub-circuit to receive the plurality of feature information and is configured to convert the plurality of feature information into a plurality of feature values, the neural network array is coupled with the converter to receive the plurality of feature values and is configured to determine the state classification corresponding to the initial neural signals according to the plurality of feature values.

4. The information processing circuit according to claim 3, wherein conductance values of the plurality of second memristors in the neural network array correspond to a weight matrix of a neural network, and the neural network array is configured to calculate the plurality of feature values to obtain a plurality of output values, and to determine the state classification corresponding to the initial neural signals according to the plurality of output values.

5. The information processing circuit according to claim 4, wherein the conversion device is further configured to obtain a plurality of opposite feature values of the plurality of feature values, respectively, a plurality of second memristors located on a same row are divided into a plurality of second memristor pairs, and each of the plurality of second memristor pairs correspond to one element in the weight matrix respectively, one second memristor of each second memristor pair is configured to receive a pulse signal of selected one feature value of the plurality of feature values, and the other second memristor in each of the second memristor pairs is configured to receive a pulse signal of an opposite feature value corresponding to the selected one feature value.

6. The information processing circuit according to claim 3, wherein the neural network array comprises a first neural network array and a second neural network array, the decoding sub-circuit further comprises an active sub-circuit, and the active sub-circuit is configured to map an output vector of the first neural network array to an input vector of the second neural network array.

7. The information processing circuits according to claim 3, wherein the feature information comprises electrical current information, and the conversion device comprises a transimpedance amplifier and a calculation circuit unit, the transimpedance amplifier is configured to convert the electrical current information into voltage information; and the calculation circuit unit is configured to perform statistics on the voltage information in a period of time to obtain the plurality of feature values.

8. The information processing circuit according to claim 1, wherein different rows of first memristors in the preprocessing array are configured to extract different feature information in the plurality of feature information respectively.

9. The information processing circuit according to claim 1, wherein the filter is a limited pulse response filter.

10. The information processing circuit according to claim 1, wherein the signal acquisition circuit is further configured to perform bias processing on the initial neural signals, so that amplitudes of the initial neural signals are within a voltage operation range of the memristors.

11. An information processing method, comprising:

obtaining a plurality of initial neural signals that are different, through a signal acquisition circuit; and processing the plurality of initial neural signals by using a plurality of memristors through a signal processing circuit comprising the plurality of memristors, wherein processing the plurality of initial neural signals by using the plurality of memristors comprises:

extracting the plurality of initial neural signals by using a preprocessing array to obtain a plurality of feature information, wherein the plurality of memristors comprise a plurality of first memristors, and the plurality of first memristors are arranged in an array to obtain the preprocessing array;

wherein the preprocessing array comprises M rows #N columns of the first memristors, and comprises M first signal lines and N second signal lines, each of the first memristors comprises a first end and a second end;

first ends of the first memristors in an m-th row are connected to an m-th first signal line, and second ends of the first memristors in an n-th column are connected to an n-th second signal line;

the N second signal lines are configured to receive the plurality of initial neural signals, so that N first memristors located on a same row form a filter to extract at least one feature information of the plurality of initial neural signals, the M first signal lines are configured to output the plurality of feature information, wherein M and N are integers and are both greater than 1, m is an integer greater than or equal to 1 and less than or equal to M, and n is an integer greater than or equal to 1 and less than or equal to N;

wherein the information processing method further comprises acquiring a plurality of inverse neural signals of the plurality of initial neural signals through the signal acquisition circuit, wherein the plurality of initial neural signals are a plurality of initial neural pulse signals, the plurality of inverse neural signals are pulse signals and correspond to the plurality of initial neural pulse signals one by one, an absolute value of an amplitude of each inverse neural signal is equal to an absolute value of an amplitude of a corresponding initial neural signal, and a polarity of each inverse neural signal is opposite to a polarity of the corresponding initial neural signal;

the N first memristors located on the same row are divided into a plurality of first memristor pairs, each of the first memristor pairs corresponds to one element in a coefficient vector of the filter respectively, and each of the first memristor pairs comprises two first memristors that are different, wherein a first memristor of each first memristor pair is configured to receive an initial neural signal selected from the plurality of initial neural signals, and the other first memristor in each first memristor pair is configured to receive an inverse neural signal corresponding to the initial neural signal selected from the plurality of initial neural signals;

in a process of processing the plurality of initial neural signals through the plurality of memristors, conductance values of the plurality of memristors are unchanged.

12. The information processing method according to claim 11, wherein processing the plurality of initial neural signals by using the plurality of memristors, further comprises:

decoding the feature information by the plurality of memristors to determine a state classification corresponding to the plurality of initial neural signals.

13. The information processing method according to claim 12, wherein the plurality of memristors further comprises a plurality of second memristors, and the plurality of second memristors are arranged in an array to obtain a neural network array, decoding the feature information to determine the state classification corresponding to the plurality of initial neural signals, comprises;

converting the plurality of feature information into a plurality of feature values; and determining the state classification corresponding to the plurality of initial neural signals by using the neural network array according to the plurality of feature values.

* * * * *